United States Patent [19]
Eto et al.

[11] Patent Number: 5,316,883
[45] Date of Patent: May 31, 1994

[54] METHOD FOR CONTROLLING PRESSURE DURING IMAGE DEVELOPMENT

[75] Inventors: Koichi Eto, Yamatokoriyama; Akira Tamagaki, Souraku, both of Japan

[73] Assignee: Sharp Kabushiki Kaisha, Osaka, Japan

[21] Appl. No.: 873,692

[22] Filed: Apr. 21, 1992

Related U.S. Application Data

[63] Continuation of Ser. No. 608,646, Nov. 2, 1990, abandoned.

[30] Foreign Application Priority Data

Nov. 4, 1989 [JP] Japan ............................ 1-287696

[51] Int. Cl.$^5$ .................................................. G03C 1/72
[52] U.S. Cl. ...................................... 430/138; 430/202; 355/100; 355/106
[58] Field of Search ................. 430/138, 202; 355/100, 355/106

[56] References Cited

U.S. PATENT DOCUMENTS

| | | | |
|---|---|---|---|
| 4,753,543 | 6/1988 | Mochimaru et al. | 400/119 |
| 4,853,743 | 6/1989 | Nagumo et al. | 355/27 |
| 4,952,968 | 7/1990 | Ibuchi | 355/27 |
| 4,984,009 | 1/1991 | Makino et al. | 355/106 |
| 5,229,351 | 7/1993 | Kamei | 430/138 |

FOREIGN PATENT DOCUMENTS 63-92954 4/1988 Japan .

*Primary Examiner*—Hoa Van Le
*Attorney, Agent, or Firm*—George W. Neuner; David G. Conlin

[57] ABSTRACT

A method for controlling pressure applied to a press roller unit during image development in which a photosensitive sheet coated with microcapsules containing photosetting materials and coloring dyes is exposed to light and then superimposed on an image receiving sheet so that the superimposed sheets are pressed together so as to form an image on the image receiving sheet. The pressure is applied or released under the controls of the timers.

3 Claims, 4 Drawing Sheets

METHOD FOR CONTROLLING PRESSURE DURING IMAGE DEVELOPMENT

This is a continuation of copending application(s) Ser. No. 07/608,646 filed on Nov. 2, 1990, now abandoned.

BACKGROUND OF THE INVENTION

1. Field of the Invention

The present invention relates to a method for controlling pressure during image development, and more particularly, to a method for controlling pressure applied to a press roller unit in an image forming apparatus in which a photosensitive sheet coated with microcapsules containing photosetting materials and coloring dyes is exposed to an image forming light and superimposed on an image receiving sheet so that the overlaying sheets are pressed together so as to form an image on the image receiving sheet.

2. Description of the Prior Art

When a photosensitive sheet coated with microcapsules containing photosetting materials and coloring dyes is exposed to an image forming light such as a reflected light from a document, the microcapsules are selectively caused to harden to form a latent image on the photosensitive sheet. An image receiving sheet is then superimposed over the latent image on the photosensitive sheet, and the two sheets are pressed together, thereby causing unhardened microcapsules to rupture allowing the coloring dyes contained therein to flow out to form a colored image on the image receiving sheet. The photosensitive sheet is normally mounted on a roll, from which the sheet is drawn out by the leading edge thereof for image forming exposure. When the photosensitive sheet is exposed to light, unexposed areas remain between the current latent image and the preceding latent image (inter-image areas) on the photosensitive sheet. Since these areas are left unexposed to light, the microcapsules in these areas rupture under pressure, thereby causing an unexpected flow-out of the coloring dyes. To prevent this, there is a proposal for applying pressure only to exposed areas. To achieve this, the press roller unit is designed to receive pressure only when it is applied.

However, the problem is that since the pressure apply/release control for the press rollers is performed on the basis of the size of the image receiving sheet, edge portions of the image receiving sheet may be stained with microcapsules that are unexpectedly ruptured.

More specifically, the known method employs a sensor for detecting an image sheet, the sensor being disposed in place before the press roller, and pressure is applied upon lapsing of a prescribed period of time after the sensor detects the leading edge of the image receiving sheet, and is released upon the lapsing of another prescribed time after the sensor detects the trailing edge of the image receiving sheet. However, when the latent image size is relatively smaller than the image receiving sheets size (particularly when the image is contracted to a smaller size), the trailing edge of the image receiving sheet extends beyond the latent image area, thereby causing an unnecessary portion of microcapsules to rupture. This stains the image receiving sheet with the ruptured coloring agent, and spoils it.

SUMMARY OF THE INVENTION

The pressure controlling method of the present invention, which overcomes the above-discussed and numerous other disadvantages of the prior art, comprises the steps of superimposing a photosensitive sheet coated with microcapsules containing photosetting materials and coloring dyes on an image receiving sheet and passing the two sheets through a press roller unit under the pressure applied by the press roller unit, thereby causing the coloring dyes to flow out from unhardened microcapsules to form an image on the image receiving sheet, wherein the pressure is applied when the leading edge of the latent image on the photosensitive sheet reaches the position of the press roller unit, and the pressure is released when the trailing edge of the latent image passes the position of the press roller unit.

In a preferred embodiment, the controlling of the pressure application is conducted by a timer adapted to measure a period of time for which the leading edge of the photosensitive sheet passes through the press roller unit.

In another preferred embodiment, the releasing of pressure is conducted by a timer adapted to measure a period of time for which the trailing edge of the photosensitive sheet reaches the press roller unit.

According to another aspect of the invention, the method comprising the steps of superimposing a photosensitive sheet coated with microcapsules containing photosetting materials and coloring dyes on an image receiving sheet and passing the two sheets through a press roller unit under the pressure applied by the press roller unit, thereby causing the coloring dyes to flow out from unhardened microcapsules to form an image on the image receiving sheet, wherein the application of pressure is controlled so as to be effected when the leading edge of the latent image on the photosensitive sheet reaches the position of the press roller unit, and the pressure is controlled so as to be released when the trailing edge of the latent image passes the position of the press roller unit, and wherein the leading edge of the latent image on the photosensitive sheet reaches the pressure section after a desired portion thereof stays in a buffer section prior to entering an exposure section until the exposure of a subsequent portion of the photosensitive sheet is finished.

Thus, the invention described herein makes possible the objectives of (1) securing clear, stainfree image on an image receiving sheet by controlling pressure applied to the superimposed photosensitive sheet and image receiving sheet, and (2) avoiding the waste of a photosensitive sheet by stopping the unnecessary rupturing of microcapsules in the unused portion of the photosensitive sheet.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 4:
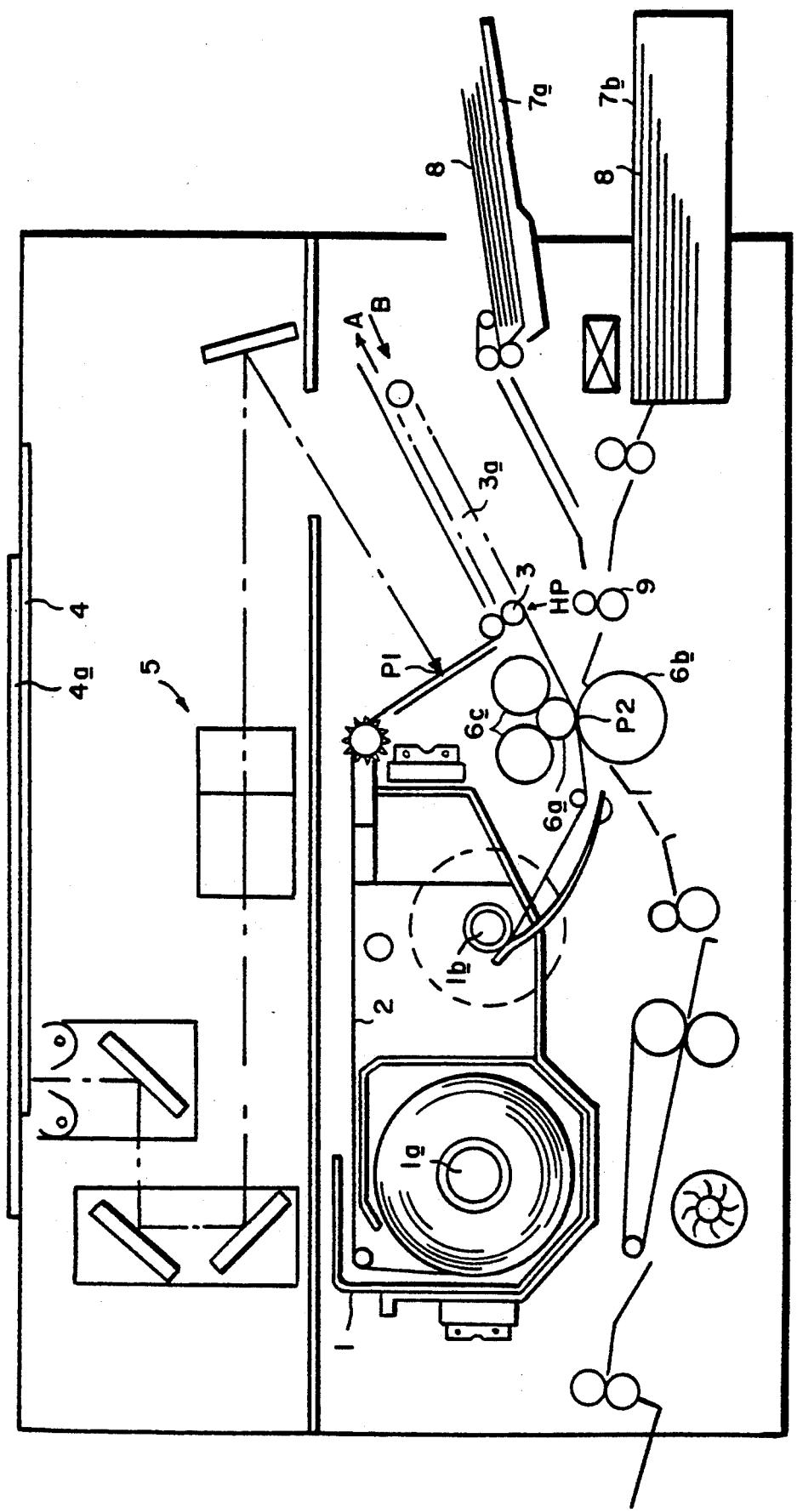
FIG. 4 is a schematic front view showing a copying machine to which the pressure control method according to the present invention is applied.

Referring to FIG. 4, a cartridge 1 is detachably mounted at one side (in the left-hand section in the illustrated copying machine). The cartridge 1 is provided with a supply shaft 1a and a take-up shaft 1b, the supply shaft 1a holding thereon a fresh photosensitive sheet 2 in a roll. The photosensitive sheet 2 has a base material formed from a plastic film and coated with microcapsules containing photosetting materials and coloring dyes, and is used in combination with an image receiving sheet. The image receiving sheet is coated with a developer that reacts with the coloring dyes to give respective colors when the microcapsules on the photosensitive sheet are ruptured causing the coloring dyes to flow out. The photosensitive sheet and the image receiving sheet are also available in other compositions than described above. For example, a photosensitive sheet is available which is coated with microcapsules containing photosetting materials and colored dyes or which is coated with a developer as well as microcapsules containing coloring dyes. When using such photosensitive sheets, the image receiving sheet can be formed from any type of paper sheet.

The photosensitive sheet 2 is pulled out from the supply shaft 1a in the cartridge and is fed by way of an exposure section P1, a buffer roller 3, and a pressure development section P2 on the copying machine, before being taken up on the take-up shaft 1b. Light reflected from a document 4a placed on a document platen 4 provided on the top surface of the copying machine is directed through an optical system 5 onto the exposure section P1. The optical system 5 includes a light source, mirrors, and a lens for scanning the document 4a and directing the reflected light onto the photosensitive sheet 2 in the exposure section P1 to form a latent image thereon. The pressure development section P2 comprises a pair of press rollers 6a and 6b which are capable of applying and releasing pressure by means of a pressure release mechanism (not shown) including a spring and a cam. The reference numeral 6c indicates backup rollers for applying uniform pressure to the press rollers 6a and 6b along the axial length thereof.

Mounted in the right-hand side of the copying machine are paper cassettes 7a and 7b which respectively hold image receiving sheets 8. The paper cassettes 7a and 7b respectively hold image receiving sheets of different sizes, and in an image forming operation, an operation panel provided on the top surface of the copying machine is operated to select either one of the paper cassettes, 7a or 7b, to feed the image receiving sheet. The image receiving sheet 8 fed from the selected paper cassette 7a or 7b temporarily stops by hitting a timing roller 9 disposed before the press rollers 6a and 6b. The timing roller 9 starts to rotate at a prescribed timing to feed the image receiving sheet 8 to the pressure development section P2 where the image receiving sheet 8 is superimposed over the latent image on the photosensitive sheet 2 for pressing together.

The buffer roller 3 is moved in the directions of arrows A and B by a motor (not shown). The home position of the buffer roller 3 is indicated by "HP" in FIG. 4. A sensor is provided at the home position to monitor where the buffer roller 3 is.

Figure 1:
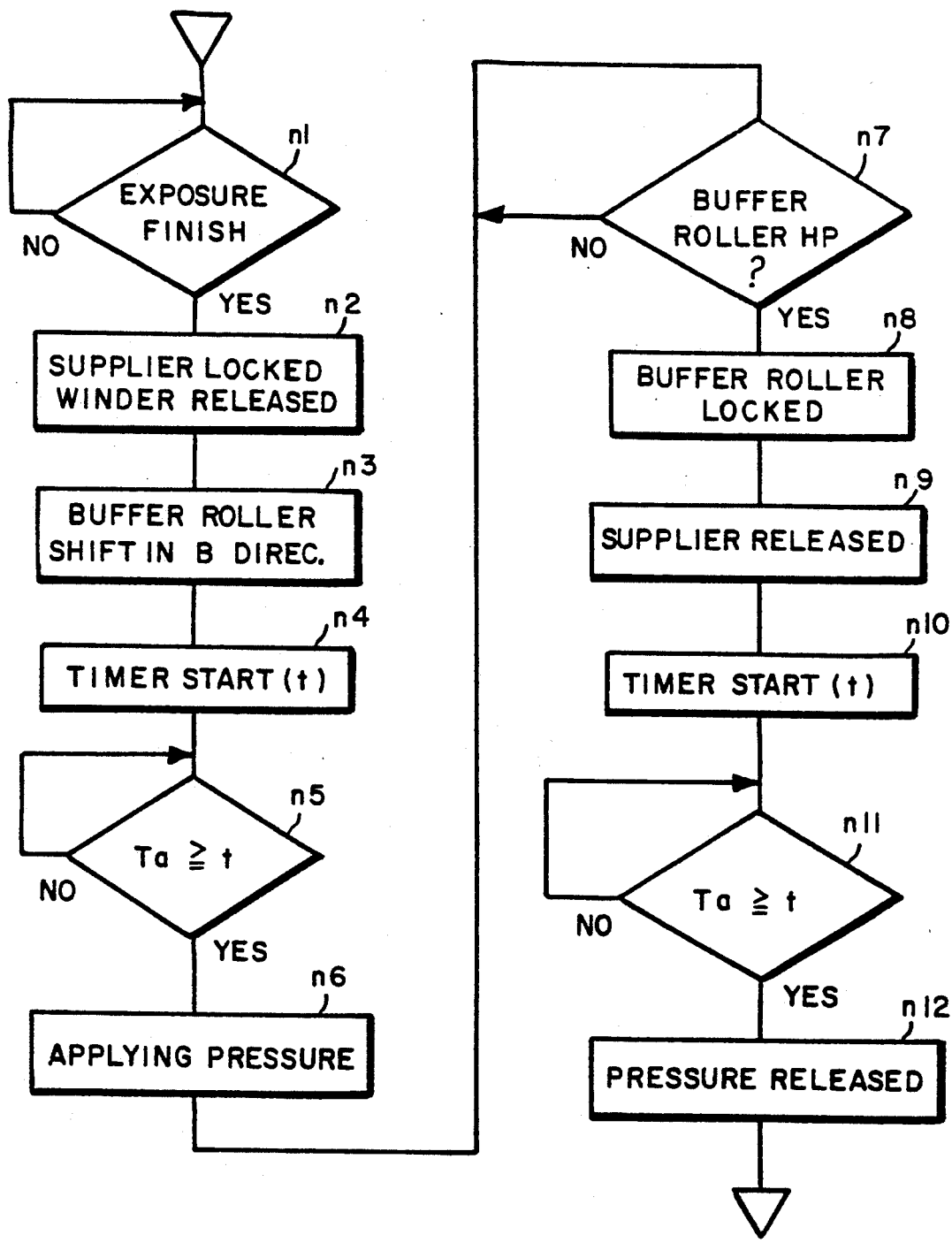
FIG. 1 is a flowchart showing the steps of controlling pressure according to the present invention.
Figure 2:
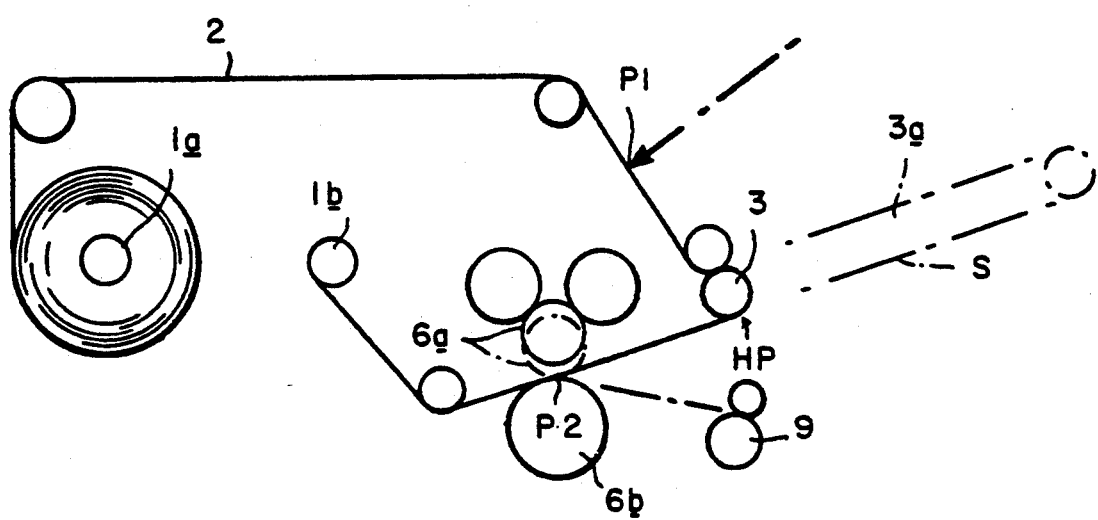
FIG. 2 is a schematic view showing a main part of the process of pressure control according to the present invention.

During the exposure process, pressure is released from the press rollers 6a and 6b while the take-up roller 1b is locked against rotation. In the meantime, the buffer roller 3 moves in the direction of arrow A to draw out the photosensitive sheet 2 from the supply shaft 1a while the photosensitive sheet 2 is exposed to light in the exposure section P1. The exposed portion of the photosensitive sheet is pulled into a buffer section 3a to the upper right of the home position of the buffer roller 3. When the exposure is completed, the buffer roller 3 moves in the direction of arrow B to feed the exposed portion of the photosensitive sheet into the pressure development section P2. As previously noted, the image receiving sheet 8 is also fed into the pressure development section P2, and the press rollers 6a and 6b are activated to apply pressure to perform the pressure development process. The application and releasing of pressure is conducted as follows:

FIG. 1 is a timing chart showing a sequence of effecting the pressure development. FIG. 2 is a diagram showing the construction of the main portion of an image forming section.

First, when the exposure process is completed, the supply shaft 1a is locked while the take-up shaft 1b is unlocked. At this stage, the press rollers 6a and 6b remains in a pressure released condition. Then in n3, the buffer roller 3 moves in the direction of arrow B, upon which the timer is started to count a period of time Ta (n4→n5). The period of time Ta represents a period of time needed for the leading edge of the latent image to reach the pressure development section P2.

On the photosensitive sheet, the preceding image forming process is completed at the point of time when the trailing edge of the preceding latent image reaches the pressure development section P2, while on the other hand the current exposure process is started from where the photosensitive sheet is positioned in the exposure section P1 at the start of exposure. Therefore, an area between P1 and P2 on the photosensitive sheet remains having no image formed (this area will hereinafter be called the inter-image area). The period of time Ta is a period during which the inter-image area is moved, which means that the leading edge of the latent image (point P1 at the start of exposure) reaches the pressure development section P2 after the period of time Ta. At the end of the exposure process, the leading edge of the latent image is positioned at point S in FIG. 2 by the movement of the buffer roller 3.

Figure 3A:
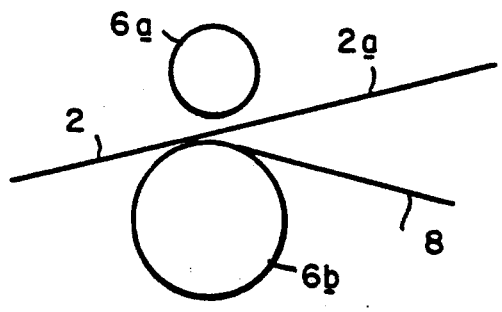
FIGS. 3(A), 3(B) and 3(C) are schematic views showing the positional relationship between a photosensitive sheet and an image receiving sheet.
Figure 3B:
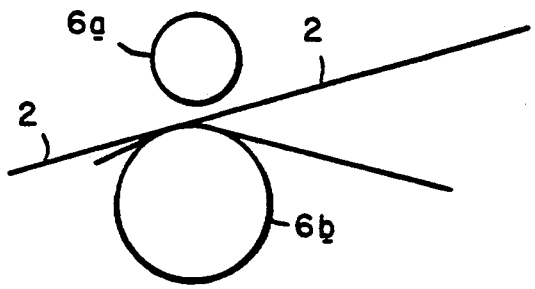

Thereafter, when the leading edge S reaches the pressure development section P2, the press rollers 6a and 6b are activated for pressing and rotation to perform the pressure development process (n6). At this stage, the image receiving sheet can be fed so that the leading edge thereof is aligned with the leading edge of the latent image 2a as shown in FIG. 3(A), or so that the leading edge of the image receiving sheet reaches the pressure development section P2 before the leading edge of the latent image 2a does, as shown in FIG. 3(B), to form an image on the middle portion of the image receiving sheet. The positional relationship between the leading edge of the image receiving sheet and that of the latent image 2a can be changed by adjusting the point of time when the timing roller 9 is rotated.

After the pressure development process is started, when the buffer roller 3 returns to the home position, the buffer roller 3 is locked in that position, and at the same time the supply shaft 1a is unlocked to allow the photosensitive sheet 2 to be drawn out therefrom so that the portion of the photosensitive sheet on which the latent image is formed is fed into the pressure development section P2 (n7→n8→n9). Then, the pressure is released from the press rollers 6a and 6b when the timer has measured the period of time Ta (n10→n11→n12).

Figure 3C:
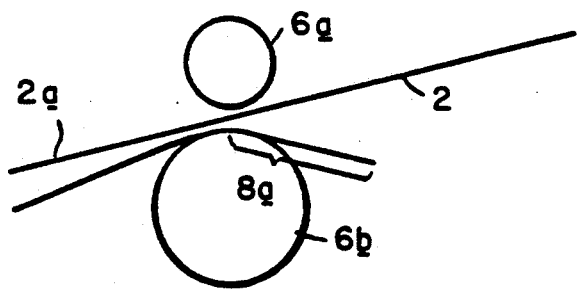

At the end of the exposure process, the trailing edge E of the latent image is positioned in the exposure section P1, and then is fed to the pressure development section P2. That is, when the buffer roller 3 returns to the home position, the trailing edge E of the latent image still stays in the exposure section P1, and by feeding the photosensitive sheet by the length P2-P1, the trailing edge E of the latent image can be brought to the pressure development section P2. As previously noted, the period of time needed to transport the photosensitive sheet by the length P2-P1 is the period of time Ta, which means that the trailing edge E of the latent image reaches the pressure development section P2 when the period of time Ta has elapsed after the buffer roller 3 returned to home position. If the pressure is released from the press rollers 6a and 6b upon the lapse of the period of time Ta, an area 8a on the image receiving sheet rearward of the latent image is protected against being stained with dyes, thus keeping the image receiving sheet clean, even when the size of the image receiving sheet 8 is larger than the size of the latent image 2a as shown in FIG. 3(C).

According to the present invention, pressure is applied and released with reference to the leading edge and trailing edge of a latent image, regardless of the size of the image receiving sheet. The present invention ensures (1) that pressure is applied when the leading edge of a latent image reaches the position of the press roller unit, thereby forming an image on the middle part of the image receiving sheet by shifting the feed timing of the image receiving sheet, and (2) that pressure is released when the trailing edge of the latent image passes the position of the press roller unit. Thus, a portion of the image receiving sheet that is situated around the latent image is protected from becoming stained with the ruptured microcapsules even if the latent image size is substantially smaller than the image receiving sheet size. As a result, a clear, decisive image is secured.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for controlling pressure during image development, the method comprising the steps of:
    exposing a photosensitive sheet coated with microcapsules containing photosetting materials and coloring dyes at an exposure section to form a latent image on the photosensitive sheet, and
    superimposing the photosensitive sheet on an image receiving sheet and passing the two sheets through a press roller unit under the pressure applied by the press roller unit, thereby causing the coloring dyes to flow out from unhardened microcapsules to form an image on the image receiving sheet,
    wherein the application of pressure is controlled so as to be effected when the leading edge of the latent image on the photosensitive sheet reaches the position of the press roller unit, and the application of the pressure is controlled so as to be released when the trailing edge of the latent image passes the position of the press roller unit,
    wherein the photosensitive sheet is kept at a buffer section provided between the exposure section and the press roller unit until the exposure is finished and is advanced to the press roller unit from the buffer section after the exposure is finished.
    wherein a time required for the leading edge of the latent image on the exposed photosensitive sheet to reach a pressure section of the press roller unit after finishing the exposure is measured by a timer means, and the press roller unit applied pressure after a period corresponding to the leading edge measured time, and
    wherein a time required for the trailing edge of the latent image on the exposed photosensitive sheet to reach the pressure section of the press roller unit after finishing the exposure is measured by another timer means, and the press roller unit releases pressure at a time corresponding to the trailing edge measured time.

2. A method for controlling pressure during image development according to claim 1, wherein the buffer section includes a reciprocating buffer roller around which the photosensitive sheet is wound.

3. A method for controlling pressure during image development, the method comprising the steps of:
    exposing a photosensitive sheet coated with microcapsules containing photosetting materials and coloring dyes at an exposure section to form a latent image on the photosensitive sheet,
    superimposing the photosensitive sheet on an image receiving sheet, and
    passing the two sheets through a press roller unit under pressure applied by the press roller unit,
    thereby causing the coloring dyes to flow out from unhardened microcapsules to form an image on the image receiving sheet,
    wherein the application of pressure is controlled so as to be effected when the leading edge of the latent image on the photosensitive sheet reaches the position of the press roller unit, and the application of the pressure is controlled so as to be released when the trailing edge of the latent image reaches the position of the press roller unit,
    wherein a buffer roller which can change a length of the feeding route of the photosensitive sheet between the exposure section and the press roller unit is movably provided between the exposure section and the press roller unit,
    wherein the photosensitive sheet is kept around the buffer roller by moving the buffer roller in the direction for lengthening the feeding route of the photosensitive sheet until the exposure is finished and is sent out from the buffer roller to the press roller unit when the exposure is finished,
    wherein a time required for the leading edge of the latent image on the exposed photosensitive sheet to reach a pressure section of the press roller unit after finishing the exposure is measured by a timer means, and the press roller unit applies pressure for a period corresponding to the leading edge measured time, and
    wherein a time required for the trailing edge of the latent image on the exposed photosensitive sheet to reach the pressure section of the press roller unit after finishing the exposure is measured by another timer means, and the press roller unit releases pressure at a time corresponding to the trailing edge measured time.

* * * * *